US006630864B2

(12) United States Patent
Yang (10) Patent No.: US 6,630,864 B2
(45) Date of Patent: Oct. 7, 2003

(54) LINEAR VARIABLE GAIN AMPLIFIERS

(75) Inventor: Jungwook Yang, West Nyack, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/341,020

(22) Filed: Jan. 13, 2003

(65) Prior Publication Data

US 2003/0137350 A1 Jul. 24, 2003

Related U.S. Application Data

(62) Division of application No. 09/685,813, filed on Oct. 10, 2000.

(51) Int. Cl.[7] .................................................. H03F 3/45
(52) U.S. Cl. ....................... 330/254; 330/300; 330/295; 360/68; 327/307
(58) Field of Search .................................. 330/252, 254, 330/261, 300, 295, 124 R, 84; 360/68; 327/307

(56) References Cited

U.S. PATENT DOCUMENTS 5,517,134 A * 5/1996 Yaklin .......................... 327/65
5,798,664 A * 8/1998 Nagahori et al. ............ 327/307
5,903,185 A * 5/1999 Cargill ......................... 327/563

* cited by examiner

Primary Examiner—Henry Choe
(74) Attorney, Agent, or Firm—Paul J. Otterstedt; Thu A. Dang; Kenneth A. Seaman (57) ABSTRACT

A system and method of controlling the operation of linear variable-gain amplifiers to allow for such linear variable gain amplifiers to have a wider operating range at high current levels, control inputs for selectable gains and improved low-voltage operation. In a first mode, the amplifier includes an additional source of current to allow for an enhanced operating range. In a second embodiment, the amplifier includes a plurality of selective resistive levels and a selection system which allows the selection of one of the resistive levels which, in turn, controls the gain range of the amplifier system of the present invention. A third embodiment of the present invention illustrates the use of an amplifier system useful for a low voltage input signal to reduce errors caused by variations in the base to emitter in the two transistors providing the amplification. Also disclosed are embodiments for reducing the error in the amplifier output by providing additional stages to provide error reducing components which are added to the amplifier output.

7 Claims, 10 Drawing Sheets

LINEAR VARIABLE GAIN AMPLIFIERS

This application is a DIV of Ser. No. 09/685,813, filed Oct. 10, 2000.

BACKGROUND OF THE INVENTION

1. Field of the Invention

The present invention is related to improvements in linear variable gain amplifiers. More particularly, the present invention relates to improvements in the operating range gain control of such amplifiers.

2. Background Art

Linear variable gain amplifiers are amplifiers which receive a pair of input signals and amplify the difference between the two signals in an output signal for subsequent use. Such amplifiers are used in many applications in common use today. For example, such devices are used in high-fidelity sound transmitting and receiving systems, as well as in servo systems such as are used for disk drive read channels.

It is desirable to control the gain of the linear variable amplifier while achieving a linear-in-dB gain control over a wide range of amplifier gains. Controlling the gain of the amplifier is accomplished typically through adjusting the bias current, as the voltage gain of the differential stage of the amplifier is directly related to the bias current.

Various systems have been proposed for increasing the gain of a linear variable gain amplifier, but the maximum bias current is limited by the lowest common mode voltage which does not have the transistors fall into the saturation region. However, as the supply voltage decreases, the usable bias level gets smaller. The prior art linear variable gain amplifier systems thus had a limited operating range, which is undesirable as it limits the usefulness of the amplifier.

Another limitation of the prior art linear variable gain amplifiers is the gain is often difficult to control and change quickly because the gain depends on the changing of current flowing through a transistor. It would be desirable to have an amplifier with discrete gain range control, but no such linear variable gain amplifier has been proposed in the prior art.

A third limitation of linear variable gain amplifiers is that low voltage applications frequently have an emitter-degenerated differential stage which makes it difficult to have a high-accuracy differential amplifier when operating at a low voltage. For applications which operate at low voltage, such as a servo control system, it would be desirable to have a high accuracy variable gain linear amplifier even when the input voltage is low.

Prior art linear variable gain amplifier systems have other limitations and disadvantages which will be apparent to those skilled in the art in view of the following description of the present invention.

SUMMARY OF THE INVENTION

The present invention overcomes the disadvantages and limitations of the prior art systems for controlling the operating range of a variable gain amplifier.

The present invention has the advantage that, in one embodiment, the linear variable gain amplifier system may obtain a high gain, with a corresponding high bias current, without driving an input transistor into saturation. Such a linear variable gain amplifier system allows the input transistors to remain in the active or linear region, rather than driving the transistors into a saturation level when the bias current goes high. Such a system allows a larger usable range of bias current levels in the linear variable gain amplifier system of the present invention.

A second advantage of the amplifier circuits of the present invention is to provide a greater gain range of the amplifier and a controlled or selected gain operating at a quick speed. In this way the same linear variable gain amplifier could be operating at one gain and switched quickly to operate at a different gain without traversing through intermediate gains through a ramping of current through a transistor operating in the linear range. In one embodiment of the present invention, an amplifier with a discrete gain range selection is provided through the use of selectable (binary or digital) control inputs. That is, a particular gain range can be selected from among several options and applied to the linear variable gain amplifier by selecting an effective resistance and switching that resistance into the amplifier circuit though the use of one or more transistors which are turned on. The same system can be operated at a different gain range at a different time by selecting a different control input, causing a different impedance and therefor a different gain to be seen by the linear variable gain amplifier system of the present invention. This gain range may be selected by applying a selected resistance across the emitter of the transistor, either individually or in selective combinations to adjust the effective resistance seen by the amplifier and thus adjust the gain of the amplifier.

A third advantage of the amplifier system of one embodiment of the present invention is a linear variable gain amplifier system suitable for low voltage applications. This system is a high-accuracy differential linear amplifier system which is particularly useful for an emitter-degenerated differential stage, allowing use of a high accuracy differential amplifier in low voltage applications (such as servo disk driver or in the IF (Intermediate frequency) or base-band amplifier for wireless receivers where the input electrical signal may be quite small and needs substantial amplification for subsequent use.

The present invention is a linear variable gain amplifier which has improved performance and enhanced operating range. The enhanced operating range originates from having a wider operating current in one embodiment and permits a lower voltage operation without degrading the performance in an other embodiment. In a third variation, the amplifier of the present invention allows for binary (or switch) selection of effective resistors, alone or in combination, to select a gain range for the amplifier.

The operating features of the present invention provide various improvements in the linear variable gain amplifier system and can be selected and combined as appropriate for a given application. Thus, one application may require both a low input and a wide operating range and another application may require selectable gain control along with either a wide operating range or a low voltage input.

Other objects and advantages of the several amplifier embodiments of the present invention will be apparent to those skilled in the relevant art in view of the following description of the preferred embodiment, taken together with the accompanying drawings and the appended claims.

BRIEF DESCRIPTION OF THE DRAWINGS

Having thus described some objects and advantages of the present invention, the present invention of an improved amplifier system and method is described in connection with the accompanying drawings in which:

DETAILED DESCRIPTION OF THE PREFERRED EMBODIMENT

In the following description of the preferred embodiments, the best implementations of practicing the invention presently known to the inventor will be described with some particularity. However, this description is intended as a broad, general teaching of the concepts of the present invention using several specific embodiments, but it is not intended to be limiting the present invention to the implementation as shown in any of these embodiments, especially since those skilled in the relevant art will recognize many variations and changes to the specific structure and operation shown and described with respect to these figures.

Figure 1:
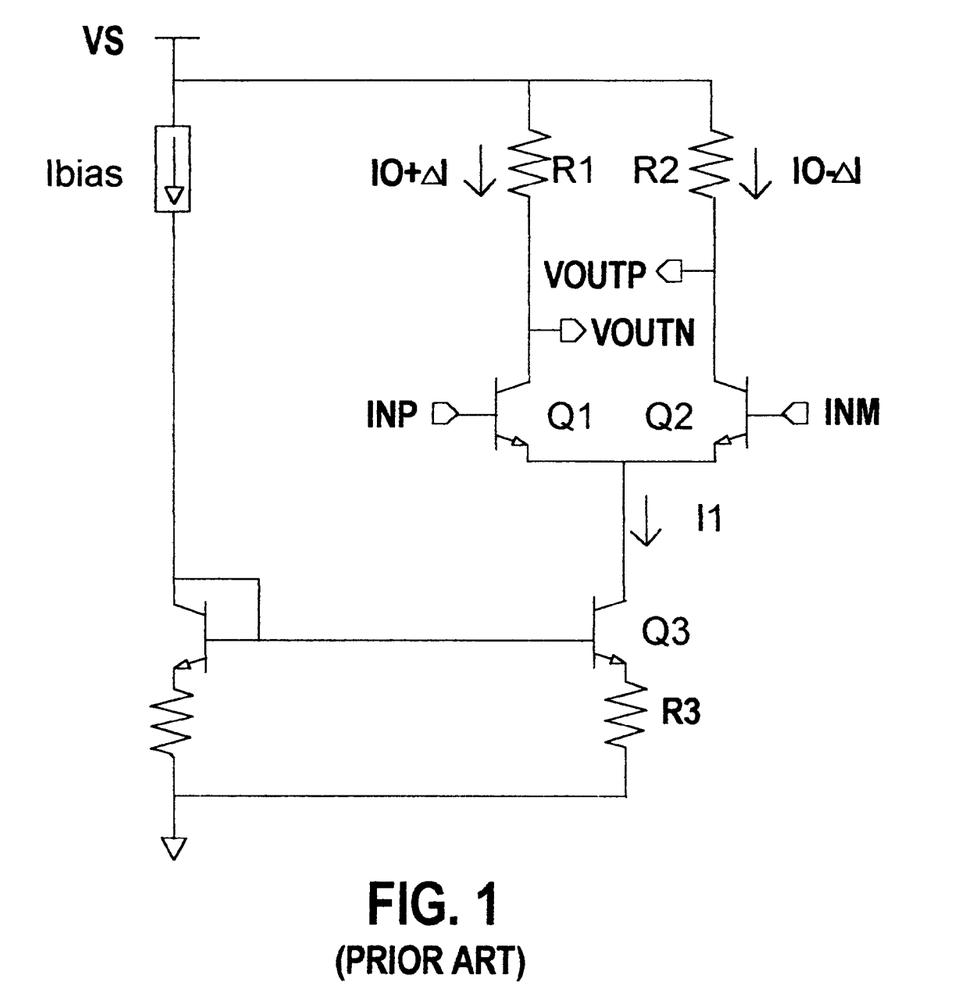
FIG. 1 is a circuit schematic diagram depicting a linear variable gain differential amplifier of the prior art.

FIG. 1 illustrates a linear, variable-gain amplifier circuit of the prior art. A plus (or positive) input INP is applied to the base of a first transistor Q1 and a minus or negative input INM is applied to the base of a second transistor Q2. The amplified output is taken between a plus (or positive) output Voutp and a minus (or negative) output Voutn at the collectors of the first transistor Q1 and the second transistor Q2. A third transistor Q3 is coupled with its emitter resistor R3 to the emitters of the first transistor Q1 and the second transistor Q2 as shown in this FIG. 1, creating a common leg through which a main tail current (or bias current) I1 passes. Resistors R1 and R2 are associated with the first transistor Q1 and the second transistor Q2, respectively. Current I0 passes through the resistors R1, R2 from a bias current source Ibias.

The gain of the amplifier is a function of bias current $I_1$ passing through the transistor Q3, through a formula $A_v = g_m \cdot R_c = I_1/V_T \cdot R_c$, where $g_m$ is the transconductance of the transistors, which is derived to be $I_1/V_T$ in bipolar transistors, where $I_1$ is the bias current and $V_T$ is the thermal voltage defined by kT/q where k is the Boltzman constant, T is the absolute temperature, and q is the charge of the electron. To increase the gain $A_v$ of the amplifier, the bias current $I_1$ must be increased. However, the maximum bias current $I_1$ is limited by the supply voltage and the minimum collector voltage of Q1 and Q2 that keeps Q1 and Q2 from working at saturation region as increase in the bias current I1 result in decreased voltage at $V_{OUTP}$ and $V_{OUTN}$. Consequently, as the supply voltage goes lower, the maximum bias current is also reduced because the voltage drop across the resistor increases as the bias current increases until the transistors Q1 and Q2 fall into saturation region based on the bias current through them. The maximum bias current $I_1$ is limited by the lowest output voltage at $V_{OUTP}$ and $V_{OUTN}$ which does not have the transistors Q1 and Q2 fall into saturation region, which is approximately 2.7 volts for a maximum input voltage of about 3.3 volts.

Figure 2:
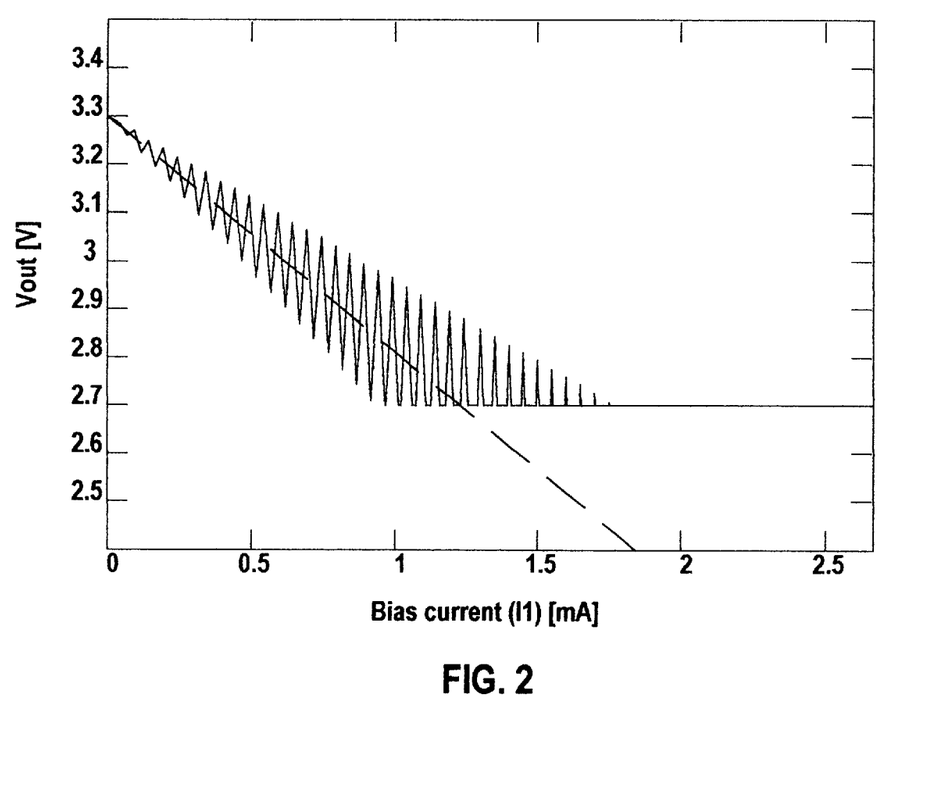
FIG. 2 is a graph of a typical response of the amplifier of FIG. 1, plotting voltage out as a function of the bias current.

FIG. 2 provides a graphical representation of a typical output for the amplifier circuit depicted in FIG. 1. This graphical representation assumes that the supply voltage Vs is 3.3 volts and when the current flowing through the transistors Q1 and Q2 is very small (approaching 0), then the gain is low (a small signal is shown near I1 approaching zero and Vs is approximately 3.3 volts). As the bias current I1 increases, the signal amplification increases through the linear region until the bias current is approximately 1 milliamp (mA) in this example as shown in FIG. 2, where the output voltage Vout is approximately 2.7 volts. At the point where the output voltage Vout is approximately 2.7 volts, the current I0 through each of the transistors Q1 and Q2 are at the verge of saturation region, and further increases in the bias current I1 are limited by the saturated state of the transistors so that the minimum Vout never goes below a saturation value of approximately 2.7 volts. This is sometimes referred to as a clamped output and is depicted in FIG. 2 as a horizontal line beginning between 1 and 2 mA of bias current I1. One objective of the present invention is to keep the common mode output voltage from decreasing to have a symmetric shape rather than a clamped output where one side of the output is limited while the other side is not.

When the shape is not symmetric because one side is clamped, the output is distorted and the useful range of the amplifier is limited. It is thus desirable to avoid having the output clamped and to provide an amplifier with increased range of operation as will be discussed in connection with the embodiment of FIG. 3 and 5 and the output of FIG. 4.

Figure 3:
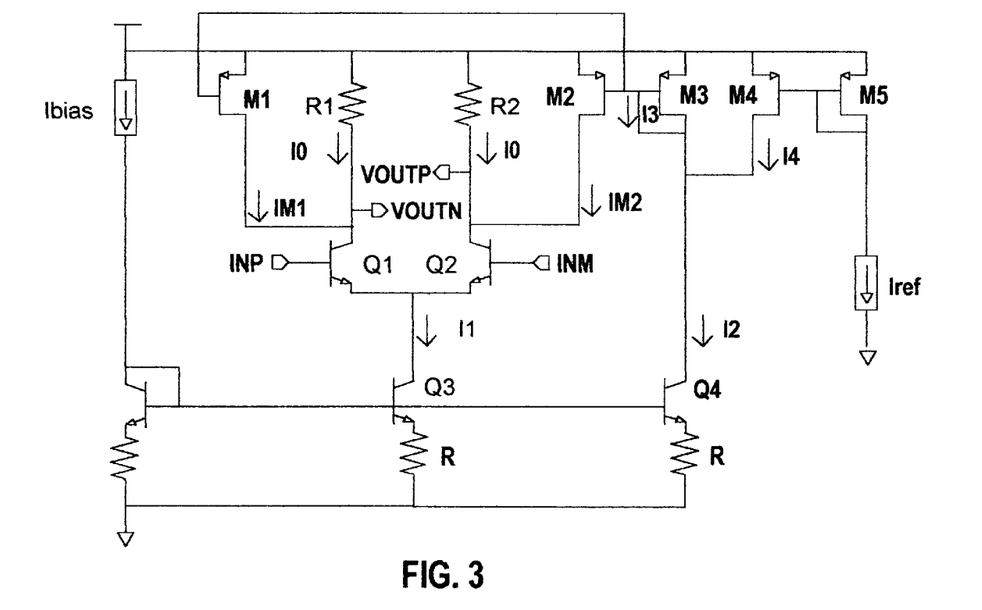
FIG. 3 is a circuit schematic diagram of one embodiment of the present invention.

FIG. 3 is a schematic circuit diagram for an improved amplifier circuit of the present invention. It includes the variable gain circuit of FIG. 1 with several field effect transistors M1, M2, M3, M4 and M5 added to selectively provide increases bias current I1 passing through the transistor Q3, increasing the gain of the amplifier without driving the transistors Q1 and Q2 into saturation. The base amplifier includes the transistors Q1 and Q2 with the associated resistors R1, R2, with inputs INP and INM and the output taken across the terminals Voutn and Voutp. Added to the base amplifier circuit of FIG. 1 are a first field effect transistor M1 coupled to provide additional current IM1 into the transistor Q1 and a second field effect transistor M2 providing current IM2 into the transistor Q2. The gate of the first field effect transistor M1 and the second field effect transistor M2 are each coupled to the gate of a field effect transistor M3. A fourth field effect transistor M4 and a field effect transistor M5 are coupled to third field effect transistor M3 as shown in FIG. 3. The first field effect transistor M1 and the second field effect transistor M2 are half the size of the third field effect transistor M3, so that the current flowing through each of the first and second field effect transistors M1 and M2 is half the current flowing through the third field effect transistor M3. An additional transistor Q4 is coupled to the third and fourth field effect transistors M3 and M4 with a current I2 passing through it which replicates the current I1 passing through the transistor Q3 because both transistors Q1 and Q3 have the same base drive.

Figure 4:
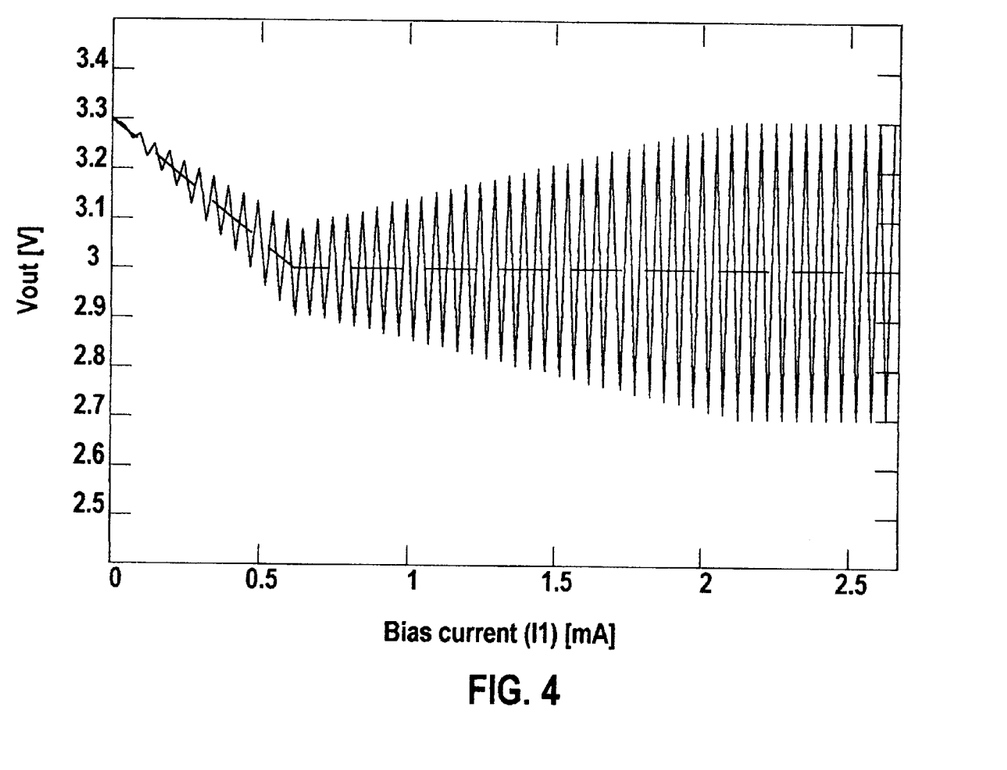
FIG. 4 is a graph of a typical response of the circuit diagrammed in FIG. 3, plotting voltage out as a function of the bias current.

In FIG. 3, the current I1 is the current which determines the gain of the amplifier as described in connection with FIG. 1. $I_{ref}$ should be set such that the voltage swing is placed in the middle of the operating range as shown in FIG. 4. The current $I_{ref}$ in the transistor M5 is the optimum current level that is required by resistors R1 and R2 such that the common mode of the output swing can be placed between the supply voltage VCC and the minimum allowed voltage at the collector nodes of Q1 and Q2. Until the current I2 reaches Iref, the transistor M3 stays off and keeps the transistors M1 and M2 off as M4 can supply the necessary current to Q4, which is I2. Once the current I2 increases past Iref, the difference in current (I2−Iref) has to be supplied from M3 as I3 because the maximum current I4 is limited by Iref by current mirroring between M4 and M5. Once M3 is turned on, half of I3 flows through each of the transistors M1 and M2 as they are mirrored with M3 and the W/L ratio of M1 and M2 is designed to be half of that in M3.

The mathematical representation of I3 is $$I3 = I2 - I4 \quad (1)$$
$$= 0 \text{ when } I2 < Iref$$
$$I2 - Iref \text{ when } I2 >= Iref$$

Hence, the bias current I0 through R1 or R2 is calculated as $$I0 = I1/2 - IM1$$
$$= (I1 - I3)/2$$

Also, I1=I2 by the design.
Substituting I3 from Equation (1) will make $$I0 = I1/2 \text{ when } I1 < Iref \quad (2)$$
$$= Iref/2 \text{ when } I1 >= Iref$$

At this point, only the necessary bias current 10 flows though each of the collector resistors R1 and R2, allowing the tail current I1 to be greater than twice the bias current 10 flowing through either resistors R1 or R2. Equation (2) above shows that the bias current through R1 and R2 increases as I1 increases until I1 reaches Iref, which is a design value to set the optimum bias condition in R1 and R2. Once I1 increases past Iref, 10 stays constant and won't change the bias level in R1 and R2.

FIG. 4 provides a graphical representation of typical output for the circuit of FIG. 3. The output common mode voltage follows the same downward path from bias current I1 of zero (where the output voltage Vout is at the supply voltage of 3.3 volts) to a point marked Iref where the voltage turns flat as the bias current increase. The point where the voltage of Vout turns flat is theoretically equal to the reference current $IrefR_c$ and is shown at a bias current I1, which is where the field effect transistor M3 of FIG. 3 turns on to provide additional current through the field effect transistors M1 and M2 to add to the current 10 passing through the transistors Q1, Q2.

The addition of the field effect transistors M1 and M2 in FIG. 3 to the variable gain amplifier of FIG. 1 has the unfortunate side effect of increasing the parasitic capacitance seen at the outputs Voutp, Voutn. Since the response time at the output of the amplifier is a function of the time constant of the amplifier system, any increase in the capacitance increases the response time and reduces the amplification during the response time, an undesirable effect. In order to reduce the effective capacitance seen at the output and to improve the amplifier response time, a cascode stage consisting of transistors Q5 and Q6 is added in FIG. 5 to the amplifier circuit of FIG. 3. The usage of transistors Q5 and Q6 reduces the parasitic capacitance effect of the field effects transistors M1, M2 in the circuit of FIG. 3 by isolating the outputs Voutp, Voutn from M1 and M2.

Figure 6:
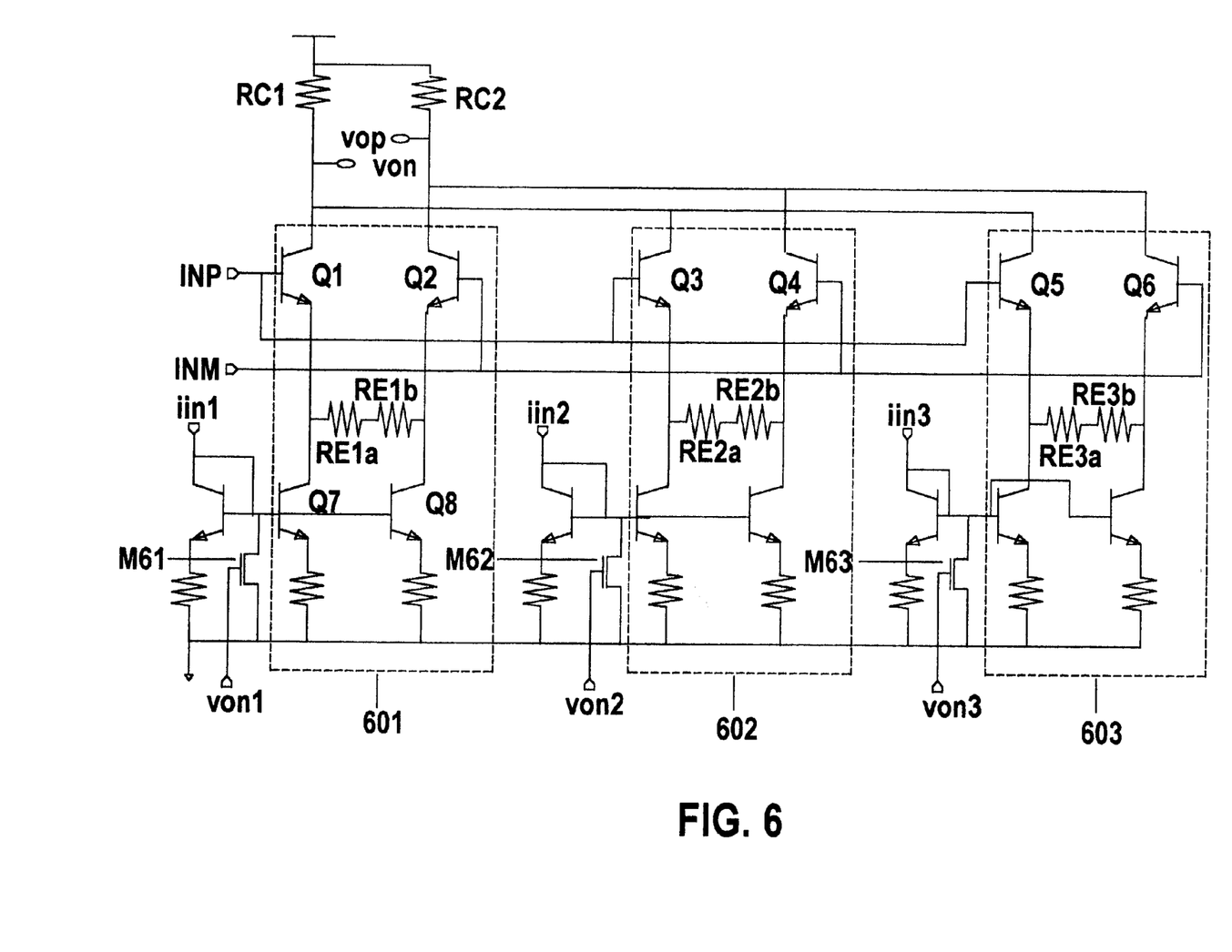
FIG. 6 is circuit schematic diagram of an other embodiment of the amplifier of the present invention

FIG. 6 is an alternate embodiment of an amplifier system capable of operating at one of a plurality of gains, where different stages 601, 602 and 603 are provided for the amplifier circuit and signal inputs provided for selecting the desired gain range. Collector load resistors RC1 and RC2 are in common, shared across the stages, and positive input INP is coupled to the base of transistors Q1, Q3 and Q5 while the minus input INM is coupled to the base of transistors Q2, Q4 and Q6.

The gain Av of the amplifier of this design can be approximated by the ratio of the collector resistor RC1 divided by the emitter resistor RE1a. So, if the collector resistor RC1 is 10 K ohms and the emitter resistor is RE1a is 1 K ohms, then the gain of the amplifier is approximately 10. To increase the gain of the amplifier, one must either increase the collector resistor RC or decrease the emitter resistor RE, which is accomplished in the present invention by switching another digital input on, either with or without switching the first digital input off. If a lower resistor replaces a previously-switched on emitter resistor, then the gain increases because of the lower emitter resistance.

So, common collector resistors RC and common outputs vop, von are coupled to a plurality of amplifier stages 601, 602, 603, each of which is controlled by an input signal von1, von2, von3, respectively, coupled to the gate of a MOSFET M61, M62, and M63, respectively, and is driven by an input current iin1, iin2 and iin3, respectively. So, the stage 601 includes a input signal von1 which is coupled to the gate of the MOSFET M61. The input signal von1 is high when the stage is to be turned off and low when the stage is to be turned on, since when the voltage is high on the input von1, then the MOSFET M61 is turned on, bringing the base of the transistor Q7 and Q9 low.

The stage 602 includes a MOSFET 62 with an input von2 used to turn the stage 602 and its emitter resistors on or off. Similarly, the stage 603 includes a MOSFET 613 and an input von3 to turn the stage and its input resistors on or off. Typically, the emitter resistors in each stage would differ from each other to provide different gains when the stages are turned on individually. Thus, the resistor RE1a might be 100 ohms, the resistor RE2a might be 200 ohms and the resistor RE3a might be 400 ohms.

If two stages are turned on at the same time, the effect is to have the resistance which is the equivalent of having the two emitter resistors in parallel, effectively reducing the resistance and increasing the gain of the amplifier, since the effect of resistors RA and RB in parallel is a resistance of (RA·RB)/(RA+RB), resistance which is less than either resistor alone. And, further, additional stages could be turned on, further reducing the effective emitter resistance and increasing the gain of the amplifier.

Figure 7:
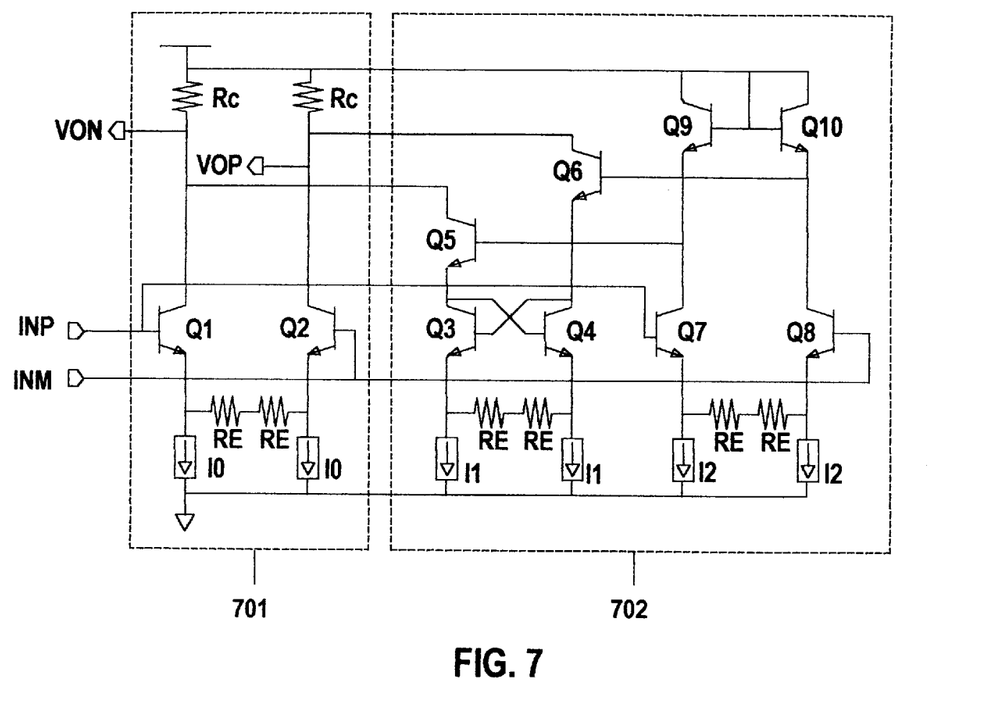
FIG. 7 is a circuit schematic diagram of yet another alternate embodiment of the present invention.

FIG. 7 is another alternate embodiment of the amplifier of the present invention and addresses the situation where an emitter-degenerated differential stage provides an output signal which is not linear enough over a wide range of input signals. It is well known that the amplifier in FIG. 1 has the gain in hyperbolic tangent function form (Av~tanh Vin). Tanh x function can be approximated to x only if x is very small, which means that the gain is linear only if the input difference is very small. In order to improve the linearity of the differential amplifier in FIG. 1, emitter degeneration resistor RE is inserted as shown in the circuit 701 in FIG. 7. The linearity of this amplifier is improved, but still there are applications where higher linearity is necessary. This non-linearity stems from differences in the transistors, particularly in the difference in the base-emitter voltages due to the current difference through the transistors as the input signal is changing. (a more detailed description is as follows: The voltage across the two emitter resistors RE should be proportional to the input voltage difference INP and INM. Otherwise the amplifier is not linear. In the circuit 701 in FIG. 7, when INP goes higher than INM, the current through transistor Q1 goes higher that the current in transistor Q2. Hence, the base-emitter voltage of Q1 is higher than that of Q2, so the voltage across between the two RE's will be smaller. If the input voltage difference is even larger, the loss in the voltage across the two RE's will be larger. Because of this effect, the gain is reduced if the input voltage difference is large.) Since the base-emitter voltage drop for a transistor is $V_T * \ln(I1/IS)$ where IS is the saturation current of the transistor, the difference in voltage drops between the base and emitter of two transistors is a function of the log of the ratios of the currents in passing through the respective transistors. This design compensates for the difference in VBE voltages between Q1 and Q2 when INP goes high and INN goes low or vice versa.

The difference in voltage between the base and emitters (sometimes called an error voltage) is replicated in an additional stage and converted to an error current which is then subtracted from the current in the main amplifier stage.

So, FIG. 7 illustrates a linear variable gain amplifier having a main stage 701 and a adjusting stage 702. The main stage is similar to that shown in other figures, particularly FIG. 1 in having a first transistor Q1 and a second transistor Q2, each receiving at its base one of the inputs INP and INM. A collector resistor RC is associated with each transistor and the outputs von and vop are taken between the collector resistors RC and the collector of the respective transistor. An emitter resistor RE is associated with each transistor and current source I0 provides current for the stage.

The stage 702 is a differential stage which includes transistor Q7 coupled to the positive input INP and transistor Q8 coupled to the negative input INM. Transistors Q9 and Q10 are coupled to the transistors Q7 and Q8, respectively, with transistor Q5 coupled to transistor Q9 and transistor Q6 coupled to transistor Q10.

The current output in the Q1–Q2 differential stage is $$I_{out1} = (V_{in} - \Delta V_{BE1,2})/2R_E \tag{3}$$

In Equation (3) above, $\Delta V_{BE1,2}$ is the error term due to the base-emitter voltage difference in Q1 and Q2. The base-emitter voltage of Q1 and Q2 are $$V_{BE1} = V_T \cdot \ln(I_1/I_S)$$

$$V_{BE2} = V_T \cdot \ln(I^2/I_S)$$

Hence, $$\Delta V_{BE1,2} = V_{BE1} - V_{BE2} \tag{4}$$
$$= V_T \ln(I_1/I_2)$$

The differential stage of Q7 and Q8 is a replica of Q1–Q2 differential stage, and hence the output current of Q7 and Q8 are the same as those through Q1 and Q2. The base-emitter voltage of Q9 and Q10 are $$V_{BE9} = V_T \cdot \ln(I_1/I_S)$$

$$V_{BE10} = V_T \cdot \ln(I_2/I_S)$$

Hence, $$V_{out9,10} = V_{BE9} - V_{BE10}$$
$$= V_T \ln(I_1/I_2).$$

From Equation (4) above, $$V_{out9,10} = V_{BE1,2} \tag{5}$$

The voltage in Equation (5) above is applied to the transconductor composed of Q3–Q6, which cancels the error voltage shown in Equation (4) [see Caprio], and the output current $I_{out2}$ from Q5–Q6 differential stage is $$I_{out2} = V_{out9,10}/2R_E \tag{6}$$
$$= \Delta V_{BE1,2}/2R_E$$

In FIG. 7, $I_{out2}$ is added to $I_{out1}$. From Equations (3) and (6) above, the output current of the overall circuit is $$I_{out} = I_{out1} + I_{out2}$$
$$= (V_{in} - \Delta V_{BE1,2})/2R_E + \Delta V_{BE1,2}/2R_E$$
$$= V_{in}/2R_E$$

Output voltage is $$V_{out} = I_{out} \cdot 2R_C \tag{7}$$
$$= R_E/R_C \cdot V_{in}$$

Hence the error term in Equation (3) above is completely removed, and the remained output is linear to the input voltage.

Intuitively, the error voltage existing in Q1–Q2 pair is replicated at the emitters of Q9 and Q10, which is converted into the equivalent error current in Q5–Q6 pair. The cross connected pair of Q3 and Q4 removes the error existing in Q5–Q6 stage, and subtracts the error current from the load resistors Rc. This cross connected differential stage composed of Q3–Q6 is a well-known circuit.

The stacking of transistor pairs Q5–Q3 and Q6–Q4 increases the supply voltage. Removing transistors Q3 and Q4 will reduce the supply voltage and enable low voltage operation. However, removing transistors Q3 and Q4 will cause error in the differential stage Q5 and Q6 as described above. Any differential stage without error compensation has error voltage in base-emitter of the transistors as described above.

Figure 8:
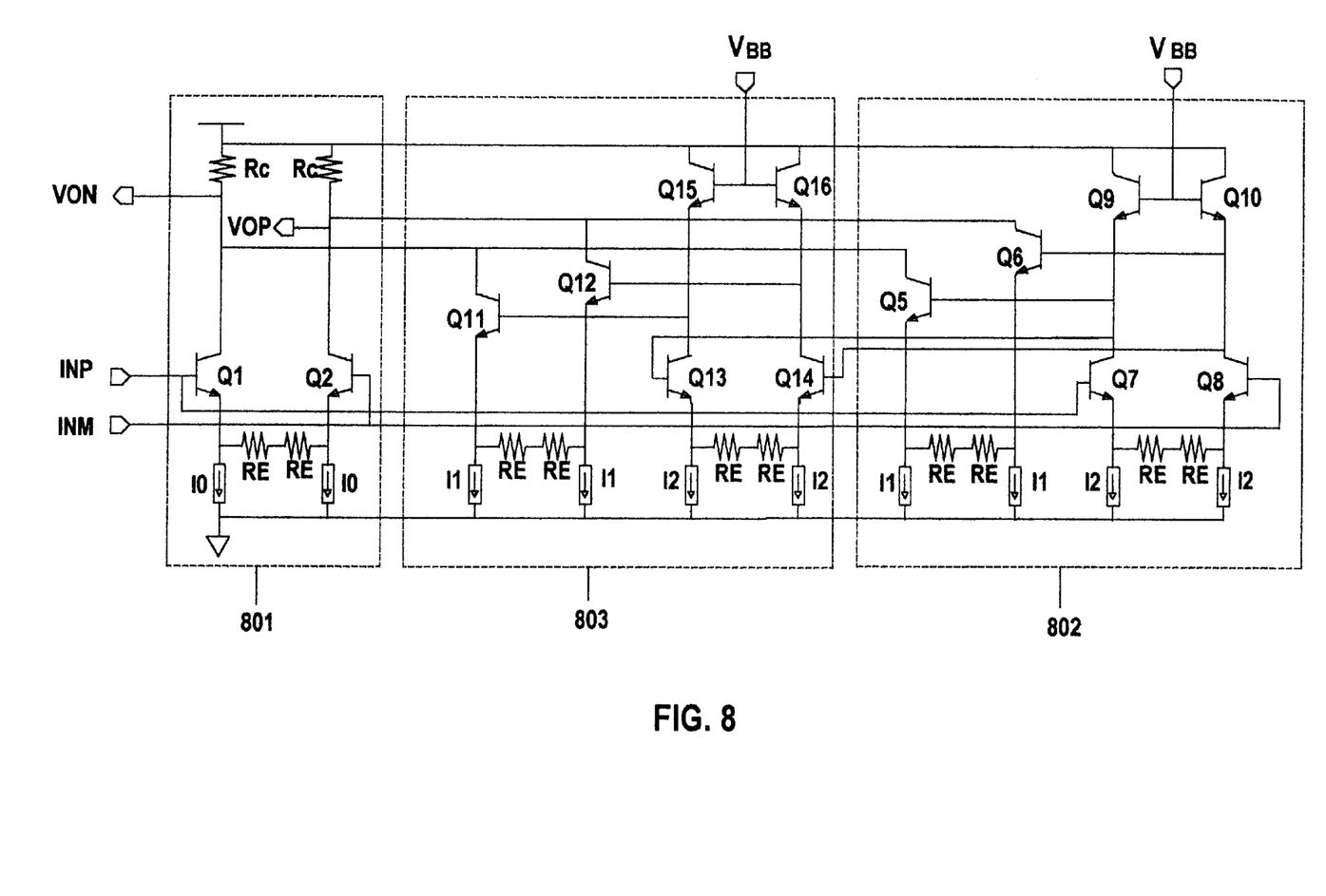
FIG. 8 is a circuit schematic diagram of an extension of the amplifier circuit of FIG. 7.

FIG. 8 illustrates a variation of the amplifier of FIG. 7. In the embodiment of this FIG. 8, the amplifier consists of a first stage 801 and a second stage 802 similar to the second stage 702 of FIG. 7 with an intermediate stage 803. The intermediate stage 803 is a repeat of the second stage 802 and reduces the error voltage. This intermediate stage 803 may be repeated as many times until the error voltage becomes acceptably small and the linearity in the output reaches an acceptable level.

The stage 802 differs from the stage 702 (in FIG. 7) in that the transistors Q3 and Q4 from stage 702 have been removed, with the output of the second stage 802 passing through the intermediate stage 803 and providing reduction in the error voltage.

When transistors Q3 and Q4 are removed from the FIG. 7 embodiment, the circuit with only transistors Q5 and Q6 makes for an error voltage which is reduced from the error voltage of stage 801. In the circuit in FIG. 7, the differential stage composed of Q3, Q4, Q5, and Q6 requires the supply voltage high. Q3 and Q4 are removed in FIG. 8. However, the differential stage with Q5 and Q6 makes error voltage, which is smaller than that in circuit 801. By using the same error voltage compensation circuit 802, the error in 802 can be further reduced. The output current $I_{out2}$ from Q5–Q6 differential stage is $$I_{out2}=(\Delta V_{BE1,2}-\Delta V_{BE5,6})/2R_E, \quad (8)$$

$$|\Delta V_{BE5,6}|<<|\Delta V_{BE1,2}|$$

The circuit of the second stage 802, which reduces the error voltage, is repeated as the circuit 803 to reduce the error voltage in second stage 802. The output current $I_{out3}$ from Q11–Q12 differential stage is $$I_{out3}=(\Delta V_{BE5,6}-\Delta V_{BE11,12})/2R_E, \quad (9)$$

$$|\Delta V_{BE11,12}|<<|\Delta V_{BE5,6}|<<|\Delta V_{BE1,2}|$$

Hence, $$\begin{aligned} I_{out} &= I_{out1} + I_{out2} + I_{out3} \\ &= (V_{in} - \Delta V_{BE11,12})/2R_E \end{aligned} \quad (10)$$

The intermediate stage 803 can be repeated as many times until the $V_{BE}$ term in Equation (10) above becomes sufficiently small to get the required linearity.

The second stage 802 reduces the error voltage and may be repeated as many times as necessary to reduce the error voltage to an acceptable value. In FIG. 8, the stage 803 is a repetition of the stage 802 and provides for a further correction of the error voltage, producing an output current which is equal to the difference in the base to emitter voltage of transistors Q11 and Q12 divided by twice the emitter resistor RE. The voltage differential of this stage is much less than the voltage difference of the previous stage 802 which in turn was much less than the voltage differential of the base amplifier 801.

Figure 9:
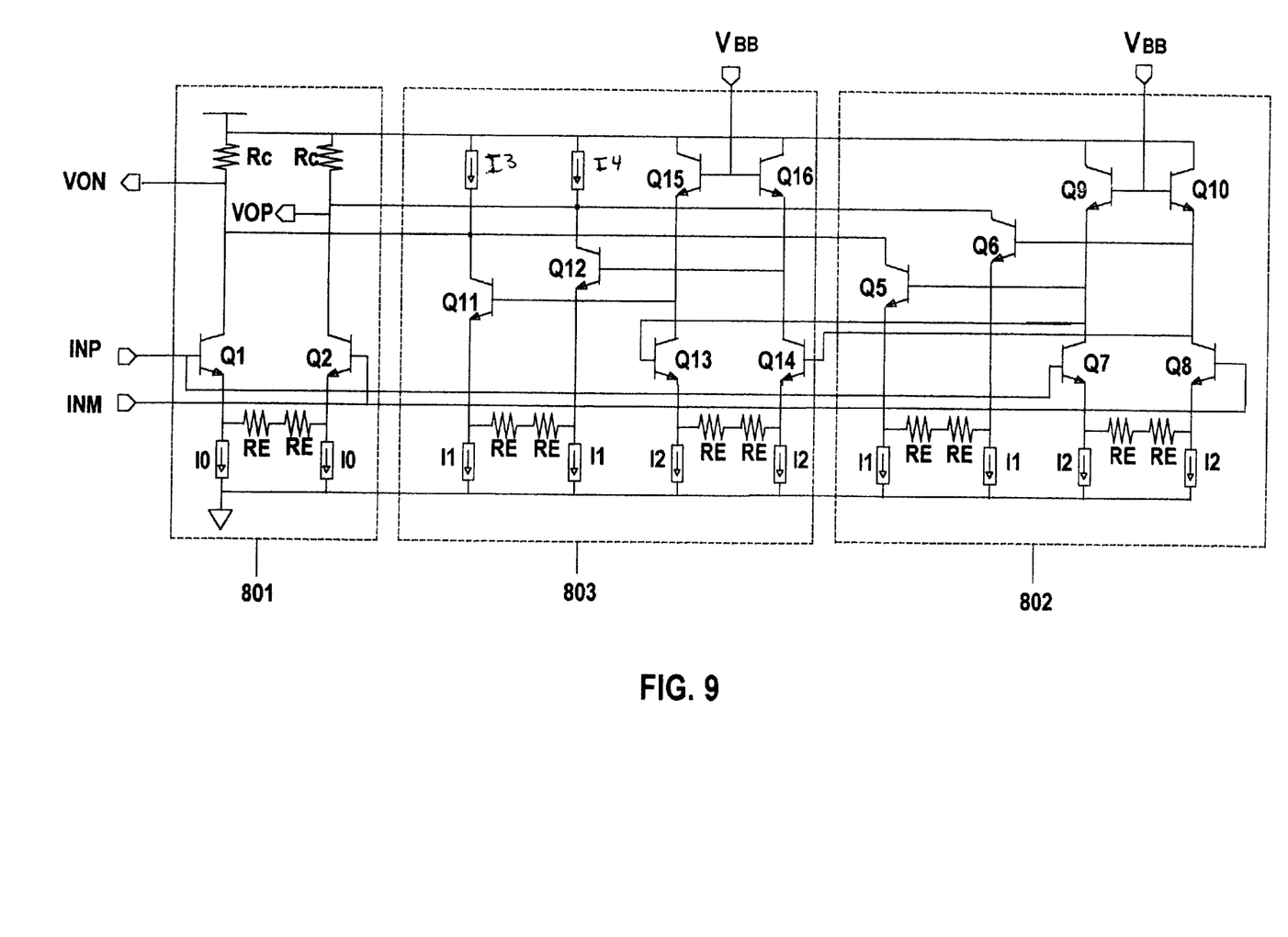
FIG. 9 is a circuit schematic diagram of a modification of FIG. 8.
Figure 10:
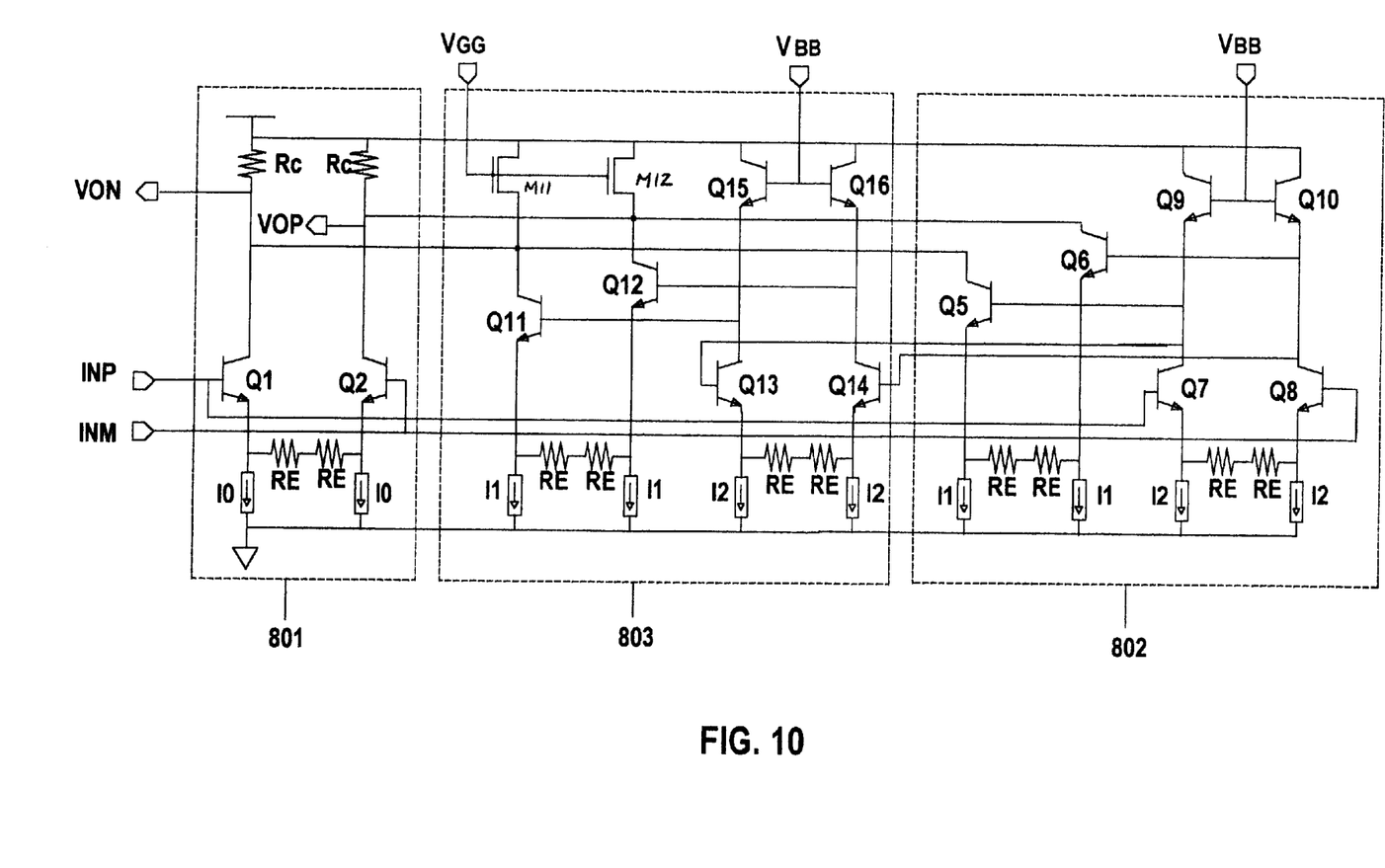
FIG. 10 is a circuit schematic diagram of a variation of the embodiments of FIGS. 8 and 9.

The current output equals the sum of the currents provided by each of the three stages 801, 802 and 803, which equals the input voltage less the voltage differential between base and emitter of the third stage 803 (for resistors Q11 and Q12) divided by twice the emitter resistor RE, which, as the voltage differential for the third stage approaches zero, means that the distortion is reduced accordingly. The third stage 803 can be repeated as many times as is necessary until the error terms gets sufficiently small to get the required linearity in output amplification. As shown in Equation (10) above, the output current is now the sum of three current components, which will cause more voltage drop in the load resistors Rc, and reduces the common mode voltage of the outputs VOP and VON compared to FIG. 7. By supplying the current to the output nodes, the additional current component can be compensated, and the common mode voltage at the output can be restored as shown in FIG. 9. The current sources can be implemented with pMOS transistors as shown in FIG. 10, but those can be implemented with any devices that can form the current sources such as bipolar pnp transistors and MesFET's. FIG. 9 is an alternate embodiment of the amplifier of FIG. 8 where transistor Q11 includes a current source I3 and transistor Q12 includes a current source I4. These current sources drive the transistors Q11 and Q12 with a uniform current and reduce the influence of the stage 803 on the error correction.

FIG. 10 is an alternate embodiment of the amplifier of FIG. 8 and FIG. 9 wherein a pMOS transistor M11 is associated with the transistor Q11 and a pMOS transistor M12 is associated with the transistor Q12, with each of the pMOS transistors M11 and M12 driven by a supply voltage VGG. This provides a more uniform current supply for the transistors Q11 and Q12 in the intermediate stage 803.

Figure 5:
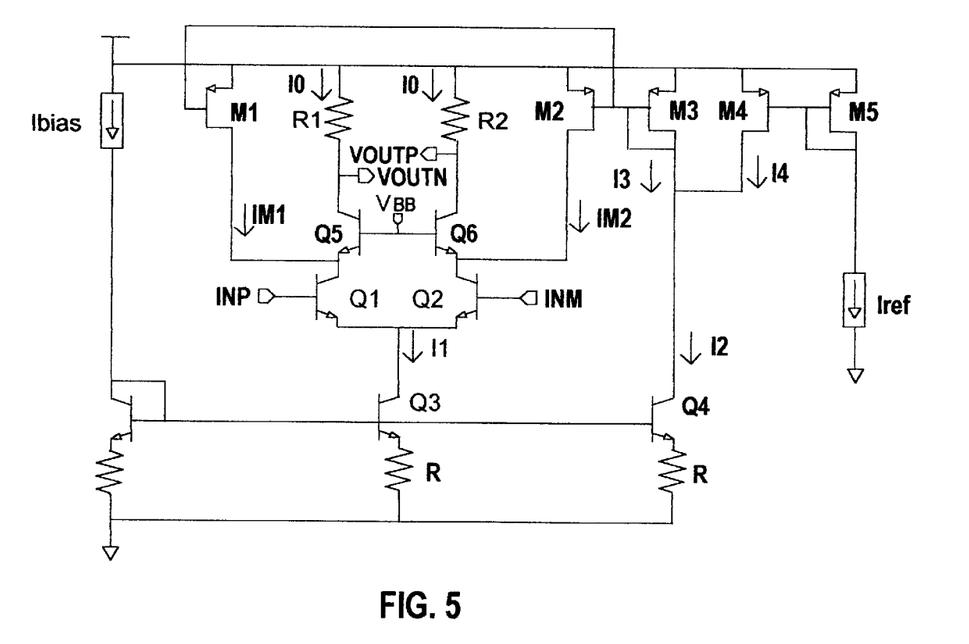
FIG. 5 is a circuit schematic diagram of a second embodiment of the present invention, an alternate design to that shown in FIG. 3.

Of course, many modifications of the present invention will be apparent to those skilled in the relevant art in view of the foregoing description of the preferred embodiment, taken together with the accompanying drawings and the appended claims. For example, an amplifier using a improved gain such as is shown in FIG. 3 could be combined with the digital inputs of FIG. 6 to provide a digitally-selectable, linear variable gain amplifier having an enhanced gain. Additionally, an amplifier with an emitter degenerated differential stage as shown in FIGS. 7 and 8 could be used with either the digital control inputs of FIG. 6 or with the improved gain amplifier as shown and described in connection with FIGS. 3 and 5. Further, some elements of the present invention can be used to advantage without the corresponding use of other elements. For example, the use of the current source in FIG. 3 could be used with or without the cascode transistors as shown in FIG. 5. The number of stages chosen in FIG. 6 and FIG. 8 are arbitrary and subject to design choice, as is the size of the elements (particularly resistors which determine the gain). While the description contemplated certain kinds of circuit elements such as FET and MOSFET transistors, those skilled in the art would be aware of other devices which have similar characteristics and which could be substituted in the circuits shown to achieve a similar result. Accordingly, the foregoing description of the preferred embodiment should be considered as merely illustrative of the principles of the present invention and not in limitation thereof

Having thus described the invention, what is claimed is:

1. A method of reducing the error in an amplifier system comprising a first stage including first and second transistors, each of the first and second transistors coupled to an input, where the amplifier system provides an amplified output signal, the steps of the method comprising:

providing a second stage with transistors substantially equal to the first and second transistors;

directly coupling the transistors of the second stage and the transistors of the first stage to the input;

operating the transistors of the second stage to provide a correction signal which is related to the error signal of the first and second transistors of the first stage relating to differences in the base to emitter voltage of the first and second transistors; and applying the correction signal to the amplified output signal to reduce the error in the amplified output signal.

2. A method of reducing error in an amplifier system of the type described in claim 1 wherein the system further includes a third stage which is similar to the second stage and the method includes the step of applying a further correction signal from the third stage to further reduce the error in the output signal.

3. A method of reducing error in an amplifier system of the type described in claim 2 wherein the method includes modifying the third stage to include at least one current source driving at least one transistor in the third stage.

4. A method of reducing error in an amplifier system of the type described in claim 3 wherein the method includes modifying the third stage to include at least one pMOS transistor driving at least one transistor in the third stage.

5. A method of reducing the error in an amplifier system including the steps of claim 1 wherein the method further includes the step of providing selectable emitter resistors, each of the emitter resistors selectively coupled to the first and second transistors and having different values to provide a selectable gain depending on which resistor is selected and seleecting one of the resistors.

6. A method of reducing the error in an amplifier system including the steps of claim 5 wherein the step of selecting one of the resistors includes the step of coupling a MOSFET transistor to the resistor and selecting the resistor by turning the MOSFET to conduct.

7. A method of reducing the error in an amplifier system including the steps of claim 6 wherein the step of selecting one of the resistors includes the step of selecting more than one resistor during the same time period to select a resistance which differs from the resistance of the selected resistors.

* * * * *